(12) United States Patent
De Boer et al.

(10) Patent No.: US 9,036,962 B2
(45) Date of Patent: May 19, 2015

(54) ARRANGEMENT OF OPTICAL FIBERS, AND A METHOD OF FORMING SUCH ARRANGEMENT

(75) Inventors: Guido De Boer, Leerdam (NL); Ralph Van Melle, Hellevoetsluis (NL); Teunis Van De Peut, Leusden (NL); Henk Derks, Waalre (NL); Frederik Matthias Spiegelhalder, The Hague (NL); Roy Josephus Stephanus Derks, Overloon (NL); Edwin Johannes Theodorus Smulders, Nuenen (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 13/452,558

(22) Filed: Apr. 20, 2012

(65) Prior Publication Data

US 2013/0043413 A1     Feb. 21, 2013

Related U.S. Application Data

(60) Provisional application No. 61/479,263, filed on Apr. 26, 2011, provisional application No. 61/477,228, filed on Apr. 20, 2011.

(51) Int. Cl.
*G02B 6/42* (2006.01)
*H01J 37/317* (2006.01)
(Continued)

(52) U.S. Cl.
CPC ........ *H01J 37/3177* (2013.01); *Y10T 156/1002* (2015.01); *B82Y 10/00* (2013.01);
(Continued)

(58) Field of Classification Search
CPC .. G02B 6/3506; G02B 6/3508; G02B 6/3556; G02B 6/3644; G02B 6/3672; G02B 6/3833; G02B 6/3837
USPC ....................................... 385/31, 80
See application file for complete search history.

(56) References Cited

U.S. PATENT DOCUMENTS 3,969,816 A * 7/1976 Swengel et al. ................. 29/879
4,818,061 A * 4/1989 Iwano et al. .................... 385/72
(Continued)

FOREIGN PATENT DOCUMENTS

EP      1441247 A1    7/2004
JP      04102708 A *  4/1992  ............... F16B 7/04
(Continued)

OTHER PUBLICATIONS

NN8907197, IBM Technical Disclosure Bulletin, Fiber-Optic Cable Strain Relief Clamp, 1989.*

*Primary Examiner* — Peter Radkowski
(74) *Attorney, Agent, or Firm* — Hoyng Monegier LLP; David P. Owen

(57) ABSTRACT

A method of forming an optical fiber array. The method comprises providing a substrate having a first surface and an opposing second surface. The substrate is provided with a plurality of apertures extending through the substrate from the first surface to the second surface. Additionally, a plurality of fibers is provided. The fibers have fiber ends with a diameter smaller than the smallest diameter of the apertures. For each fiber, from the first surface side of the substrate, the fiber is inserted in a corresponding aperture such that the fiber end is positioned in close proximity of the second surface. Then the fiber is bent in a predetermined direction such that the fiber abuts a side wall of the aperture at a predetermined position. Finally, the bent fibers are bonded together using an adhesive material.

13 Claims, 11 Drawing Sheets

(51) Int. Cl.
*B82Y 10/00* (2011.01)
*B82Y 40/00* (2011.01)
*G02B 6/36* (2006.01)

(52) U.S. Cl.
CPC .............. *B82Y 40/00* (2013.01); *G02B 6/3612* (2013.01); *H01J 2237/0435* (2013.01); *H01J 2237/2482* (2013.01)

(56) References Cited

U.S. PATENT DOCUMENTS

| | | | |
|---|---|---|---|
| 5,394,498 A * | 2/1995 | Hinterlong et al. | 385/115 |
| 6,209,827 B1 * | 4/2001 | Kawai | 248/73 |
| 6,522,817 B2 * | 2/2003 | Moran | 385/120 |
| 6,546,182 B2 * | 4/2003 | Calvet et al. | 385/139 |
| 6,618,541 B2 * | 9/2003 | Kaiser et al. | 385/137 |
| 6,633,719 B2 * | 10/2003 | Basavanhally et al. | 385/137 |
| 6,835,002 B2 * | 12/2004 | Bruns | 385/80 |
| 6,919,952 B2 * | 7/2005 | Kruit | 355/67 |
| 6,958,804 B2 * | 10/2005 | Wieland et al. | 355/67 |
| 7,024,090 B2 * | 4/2006 | Jeantilus et al. | 385/137 |
| 7,039,274 B2 * | 5/2006 | Okada et al. | 385/31 |
| 7,146,065 B2 * | 12/2006 | Niitsu et al. | 385/14 |
| 7,851,774 B2 * | 12/2010 | Lin et al. | 250/492.22 |
| 2002/0172491 A1 * | 11/2002 | Calvet et al. | 385/139 |
| 2003/0219572 A1 * | 11/2003 | Kruit | 428/195.1 |
| 2004/0042732 A1 * | 3/2004 | Bruns | 385/71 |
| 2004/0094328 A1 * | 5/2004 | Fjelstad et al. | 174/251 |
| 2004/0129871 A1 * | 7/2004 | Laberge et al. | 250/231.18 |
| 2004/0135983 A1 * | 7/2004 | Wieland et al. | 355/67 |
| 2005/0100282 A1 * | 5/2005 | Okada et al. | 385/46 |
| 2005/0123231 A1 * | 6/2005 | Niitsu et al. | 385/14 |
| 2006/0132778 A1 * | 6/2006 | Curry et al. | 356/417 |
| 2009/0268184 A1 * | 10/2009 | Lin et al. | 355/67 |

FOREIGN PATENT DOCUMENTS

| | | | | |
|---|---|---|---|---|
| JP | 2000009262 A * | 1/2000 | | F16L 3/12 |
| WO | WO 2009127659 A2 | 10/2009 | | |

* cited by examiner

ARRANGEMENT OF OPTICAL FIBERS, AND A METHOD OF FORMING SUCH ARRANGEMENT

BACKGROUND OF THE INVENTION

1. Field of the Invention

The invention relates to an arrangement of optical fibers. The invention further relates to a method of forming an optical fiber array. Finally, the invention relates to a modulation device and a lithographic apparatus comprising such arrangement.

2. Description of the Related Art

Charged particle multi-beamlet systems are known in the art, for example from U.S. Pat. No. 6,958,804 and/or from WO2009/127659, both in the name of the applicant, the latter one, being specifically adapted for very high volume throughput operation. Such lithography system uses a plurality of charged particle beamlets to transfer a pattern to a target surface. The system may operate with a continuous radiation source or with a source operating at constant frequency. Pattern data are sent by means of pattern data carrying light beams to a modulation device. The modulation device may then include light sensitive elements capable of converting received light signals into corresponding electric signals. The electric signals are then used to modulate the beamlets by electrostatic deflection. Finally, the modulated beamlets are transferred to the target surface.

Modulated light beams may be transferred using optical fibers. However, in order to obtain accurate data transfer, such optical fibers need to be aligned very accurately with respect to the light sensitive elements to allow accurate and reliable data transfer. In multi-beam charged particle lithography systems as described above the number of optical fibers is extremely high, and may easily be in the order of 10,000. Consequently, positioning of the fibers needs to be done very accurately. Such accurate placement is not straightforward. Furthermore, the volume being occupied by such large amount of optical fibers is preferably as small as possible, to enable the apparatus to be of limited size. Therefore, it is an object of the invention to provide an optical fiber arrangement or fiber array with very accurate positioning of the fibers, while occupying limited space.

BRIEF SUMMARY OF THE INVENTION

The invention provides in one aspect a method of forming an optical fiber array, the method comprising: providing a substrate having a first surface and an opposing second surface, the substrate being provided with a plurality of apertures extending through the substrate from the first surface to the second surface; providing a plurality of fibers, the fibers having fiber ends with a diameter smaller than the smallest diameter of the apertures; for each fiber, inserting, from the first surface side of the substrate, the fiber in a corresponding aperture such that the fiber end is positioned in close proximity of the second surface and bending the fiber in a predetermined direction such that the fiber abuts a side wall of the aperture at a predetermined position; and bonding the bent fibers together using an adhesive material.

The apertures in the substrate may be arranged in an array at positions corresponding to an array of light sensitive elements such as photo diodes. The substrate may be used to position the fiber ends at positions corresponding to an array of light sensitive elements such as photo diodes, the second surface of the substrate facing the light sensitive elements and the first surface facing away from them. The fiber ends may be positioned so that light emitted from the fiber ends is directed onto the light sensitive elements.

The fibers may have an outer jacket or coating which is stripped from the portion of the fibers inserted into the apertures, or the fibers may be inserted into the apertures without stripping. The fiber ends have a diameter smaller than the smallest diameter of the apertures, so that stripping the outer jacket or coating will reduce the required diameter of the apertures.

The fibers are inserted from the first surface side of the substrate sufficiently far into the apertures so that the fiber ends are flush with the second surface, or are inside the aperture but close to the second surface, or extend slightly outside the aperture. Alternatively, the fibers may be inserted all the way through the apertures and the protruding portions of the fibers may be cut off to result in the fiber ends being positioned in close proximity of the second surface.

Each fiber is inserted into a corresponding aperture from the first surface side of the substrate, leaving a length of fiber extending out from the aperture at the first surface side, and the extending length of fiber is bent in a predetermined direction. All of the fibers may be bent in the same direction. The amount of bending of each fiber is sufficient to cause at least a portion of the fiber positioned in the corresponding aperture to be pushed into abutment with a side wall of the aperture at a predetermined position. The bending of each fiber may be performed by a predetermined amount and at a predetermined position sufficiently close to the corresponding aperture so that at least a portion of the fiber positioned in the corresponding aperture is pushed into abutment with a side wall of the aperture at a predetermined position. The fibers may each have a length of fiber extending out from the aperture at the first surface side of the substrate, and at least a portion of the extending fiber lengths may be bent in a predetermined direction. The apertures in the substrate may be arranged in a two-dimensional array having rows, the fibers each having a length of fiber extending out from the apertures at the first surface side of the substrate, and the bending of the fibers may be performed by bending the fibers inserted into a first row of the apertures at a first radius of curvature, and bending the fibers inserted into a next adjacent row of the apertures at a second greater radius of curvature.

The bent fibers may be stacked in a predefined spatial arrangement, and may be stacked in a rectangular arrangement. The fibers may each have a length of fiber extending out from the aperture at the first surface side of the substrate. At least a portion of the extending fiber lengths may be arranged to run substantially parallel to the first surface. At least a portion of the extending fiber lengths may be arranged to run substantially parallel to each other in the same direction in a predetermined spatial arrangement. The predetermined spatial arrangement may comprise equidistant spacing of the extending fiber lengths in an array formation, and spacing elements may be located between the extending fiber lengths to position the extending fiber lengths with respect to each other.

At least a portion of the extending fiber lengths may be bonded together using an adhesive material. The portions of the extending fiber lengths which are bonded together may include the bent portions or unbent portions or both bent and unbent portions. The adhesive material may comprise a glue, an epoxy, or an epoxy encapsulant. The bonding may comprise curing the adhesive applied to the fibers. The curing may comprise exposing the adhesive to UV light, and/or may comprise applying heat to the adhesive.

The fiber ends may be secured within the apertures. Securing the fiber ends in the apertures may be executed after insertion of all of the fibers in corresponding apertures. The fiber ends may be secured in the apertures using an adhesive. Prior to inserting the fibers in the apertures, an adhesive may be applied onto the fiber ends, and securing the fiber ends may comprise curing the adhesive applied on the fiber ends. The curing may comprise exposing the adhesive to UV light, and/or may comprise applying heat to the adhesive. Alternatively, the fiber ends may be secured by clamping.

The method may further comprise polishing the second surface of the substrate. The polishing may include polishing the fiber ends and the second surface at the same time.

The apertures may have a cross-sectional shape consisting of a circular portion and an additional portion in the form of a groove, and the fibers may be bent in such direction that the predetermined position at which the fibers abut the side wall of the apertures is within the additional portion. The groove may form a wedge shape, the fibers abutting two opposing portions of the wedge shape. The amount of bending of each fiber may be sufficient to cause at least a portion of the fiber positioned in the corresponding aperture to be pushed into the groove. The apertures in the substrate may be arranged in an array at positions corresponding to an array of light sensitive elements such as photo diodes, and the groove in each aperture may be located so that the fiber ends are positioned at a desired location with respect to the light sensitive elements.

The fibers may be bent on top of a bending structure. The bending structure may form an integral part of the substrate at the first surface side of the substrate, or the bending structure may be a temporary removable structure. The bending of the fibers may be performed by bending a portion of the fibers over a curved section of the bending structure so that the curvature of the bent part of the portion of fibers follows the curvature of the bending structure. The apertures in the substrate may be arranged in a two-dimensional array having rows, the fibers each having a length of fiber extending out from the apertures at the first surface side of the substrate, and the bending of the fibers may be performed by bending the fibers inserted into a first row of the apertures over a curved section of the bending structure so that the curvature of the bent part of the fibers in the first row of the apertures follows the curvature of the bending structure. The bending of fibers inserted into a next adjacent row of the apertures may be performed by bending the fibers inserted into the next adjacent row of apertures over the curved section of the fibers inserted into the first row of apertures. The bending of fibers inserted into a each row of the apertures may be performed by bending the fibers over the curved section of the fibers inserted into the preceding row of apertures.

Bonding the bent fibers together may comprise: forming a mold around the plurality of bent fibers; filling the mold with an adhesive material; and curing the adhesive material. The resulting bonded structure increases the stiffness and structural integrity of the bent fibers.

In another aspect the invention provides an arrangement of optical fibers comprising: a substrate having a first surface and an opposing second surface, the substrate being provided with a plurality of apertures extending through the substrate from the first surface to the second surface; a plurality of fibers, each fiber having a fiber end with a diameter smaller than the smallest diameter of a corresponding aperture in the substrate. Each fiber is inserted from the first surface side of the substrate into the corresponding aperture so that the fiber end is positioned in close proximity of the second surface, the fiber having a length extending from the aperture out from the first surface. The extending length of each fiber is bent in a predetermined direction so that the fiber abuts a side wall of the corresponding aperture at a predetermined position, and the extending lengths of the fibers are bonded together using an adhesive.

The apertures in the substrate may be arranged in an array at positions corresponding to an array of light sensitive elements, so that the fiber ends are positioned so that light emitted from the fiber ends is directed onto the light sensitive elements.

The extending lengths of the fibers may be all bent in the same direction. The apertures in the substrate may be arranged in a two-dimensional array having rows, the fibers inserted into a first row of the apertures having a portion of their extending lengths bent at a first radius of curvature, and the fibers inserted into a next adjacent row of the apertures having a portion of their extending lengths bent at a second greater radius of curvature. Alternatively, the apertures in the substrate may be arranged in a two-dimensional array having rows, and all of the fibers inserted into each row of the apertures may have a portion of their extending lengths bent at a same radius of curvature, and the radius of curvature of the fibers of each row may also be the same.

At least a portion of the extending lengths of the fibers may be stacked in a predefined spatial arrangement, and may be stacked in a rectangular arrangement. At least a portion of the extending fiber lengths may be arranged to run substantially parallel to the first surface. At least a portion of the extending fiber lengths may be arranged to run substantially parallel to each other in the same direction in a predetermined spatial arrangement. The predetermined spatial arrangement may comprise equidistant spacing of the extending fiber lengths in an array formation, and spacing elements may be located between the extending fiber lengths to position the extending fiber lengths with respect to each other.

At least a portion of the extending lengths of the fibers may be bonded together using an adhesive. The fiber ends may be secured within the apertures, and an adhesive may be used to secure the fiber ends. The adhesive for bonding the extending lengths and/or the fiber ends may comprise a glue, an epoxy, or an epoxy encapsulant.

At least a portion of the extending lengths of the fibers may be bent as described herein, stacked in a spatial arrangement as described herein, and bonded together as described herein to form a unitary structure. This unitary structure may be substantially rigid, and may be enclosed in an enclosing structure.

The apertures may have a cross-sectional shape consisting of a circular portion and an additional portion in the form of a groove, and the fibers may be bent in such a direction that the predetermined position at which the fibers abut the side wall of the apertures is within the additional portion.

BRIEF DESCRIPTION OF THE DRAWINGS

Various aspects of the invention will be further explained with reference to embodiments shown in the drawings wherein.

DESCRIPTION OF ILLUSTRATIVE EMBODIMENTS

The following is a description of various embodiments of the invention, given by way of example only and with reference to the figures. The figures are not drawn to scale and merely intended for illustrative purposes.

Figure 1:
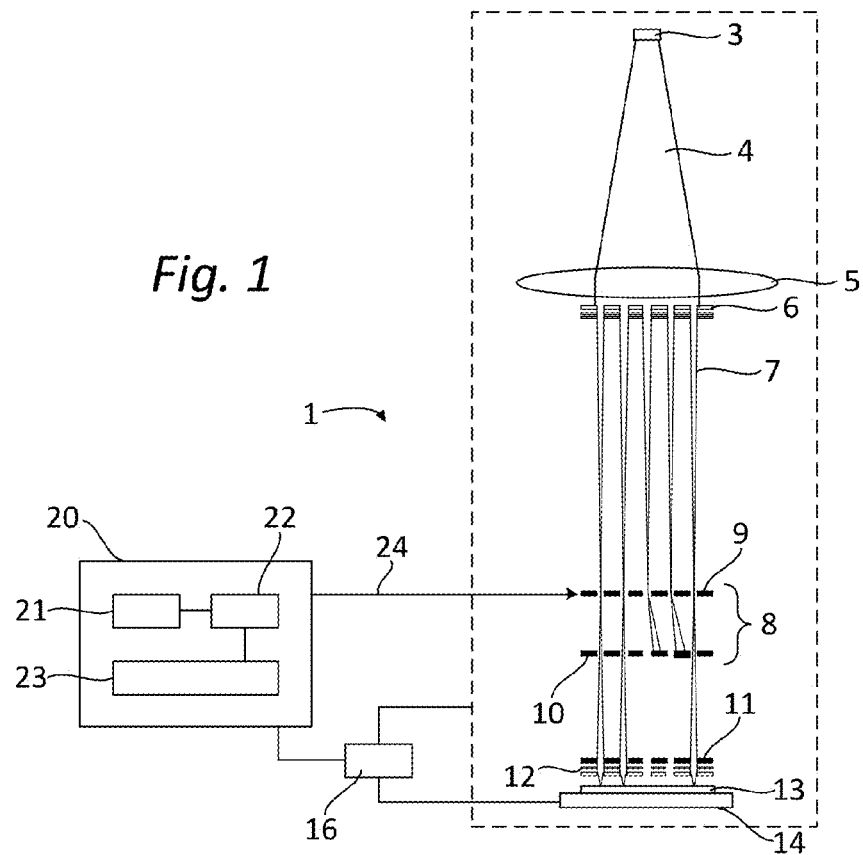
FIG. 1 schematically shows a maskless lithography system that may be used in embodiments of the inventions.

FIG. 1 shows a simplified schematic drawing of an embodiment of a charged particle multi-beamlet lithography system 1. The lithography system 1 suitably comprises a beamlet generator generating a plurality of beamlets, a beamlet modulator patterning the beamlets to form modulated beamlets, and a beamlet projector for projecting the modulated beamlets onto a surface of a target.

The beamlet generator typically comprises a source and at least one beam splitter. The source in FIG. 1 is an electron source 3 arranged to produce a substantially homogeneous, expanding electron beam 4. The beam energy of the electron beam 4 is preferably maintained relatively low in the range of about 1 to 10 keV. To achieve this, the acceleration voltage is preferably low, and the electron source 3 may be kept at a voltage between about −1 to −10 kV with respect to the target at ground potential, although other settings may also be used.

In FIG. 1 the electron beam 4 from the electron source 3 passes a collimator lens 5 for collimating the electron beam 4. The collimator lens 5 may be any type of collimating optical system. Before collimation, the electron beam 4 may pass a double octopole (not shown). Subsequently, the electron beam 4 impinges on a beam splitter, in the embodiment of FIG. 1 an aperture array 6. The aperture array 6 preferably comprises a plate having through-holes. The aperture array 6 is arranged to block part of the beam 4. Additionally, the array 6 allows a plurality of beamlets 7 to pass through so as to produce a plurality of parallel electron beamlets 7.

The lithography system 1 of FIG. 1 generates a large number of beamlets 7, preferably about 10,000 to 1,000,000 beamlets, although it is of course possible that more or less beamlets are generated. Note that other known methods may also be used to generate collimated beamlets. A second aperture array may be added in the system, so as to create subbeams from the electron beam 4 and to create electron beamlets 7 from the subbeam. This allows for manipulation of the subbeams further downstream, which turns out beneficial for the system operation, particularly when the number of beamlets in the system is 5,000 or more.

The beamlet modulator, denoted in FIG. 1 as modulation system 8, typically comprises a beamlet blanker array 9 comprising an arrangement of a plurality of blankers, and a beamlet stop array 10. The blankers are capable of deflecting one or more of the electron beamlets 7. In embodiments of the invention, the blankers are more specifically electrostatic deflectors provided with a first electrode, a second electrode and an aperture. The electrodes are then located on opposing sides of the aperture for generating an electric field across the aperture. Generally, the second electrode is a ground electrode, i.e. an electrode connected to ground potential.

To focus the electron beamlets 7 within the plane of the blanker array 9 the lithography system may further comprise a condenser lens array (not shown).

In the embodiment of FIG. 1, the beamlet stop array 10 comprises an array of apertures for allowing beamlets to pass through. The beamlet stop array 10, in its basic form, comprises a substrate provided with through-holes, typically round holes although other shapes may also be used. In some embodiments, the substrate of the beamlet stop array 10 is formed from a silicon wafer with a regularly spaced array of through-holes, and may be coated with a surface layer of a metal to prevent surface charging. In some further embodiments, the metal is of a type that does not form a native-oxide skin, such as CrMo.

The beamlet blanker array 9 and the beamlet stop array 10 operate together to block or let pass the beamlets 7. In some embodiments, the apertures of the beamlet stop array 10 are aligned with the apertures of the electrostatic deflectors in the beamlet blanker array 9. If beamlet blanker array 9 deflects a beamlet, it will not pass through the corresponding aperture in the beamlet stop array 10. Instead the beamlet will be blocked by the substrate of beamlet block array 10. If beamlet blanker array 9 does not deflect a beamlet, the beamlet will pass through the corresponding aperture in the beamlet stop array 10. In some alternative embodiments, cooperation between the beamlet blanker array 9 and the beamlet stop array 10 is such that deflection of a beamlet by a deflector in the blanker array 9 results in passage of the beamlet through the corresponding aperture in the beamlet stop array 10, while non-deflection results in blockage by the substrate of the beamlet stop array 10.

The modulation system 8 is arranged to add a pattern to the beamlets 7 on the basis of input provided by a control unit 20. The control unit 20 may comprise a data storage unit 21, a read out unit 22 and data converter 23. The control unit 20 may be located remote from the rest of the system, for instance outside the inner part of a clean room. The control system may further be connected to an actuator system 16. The actuator system is arranged for executing a relative movement of the electron-optical column represented by the dashed line in FIG. 1 and a target positioning system 14.

Modulated light beams 24 holding pattern data are transmitted to the beamlet blanker array 9 using optical fibers.

More particularly, the modulated light beams 24 from optical fiber ends are projected on corresponding light sensitive elements located on the beamlet blanker array 9. The light sensitive elements may be arranged to convert the light signal into a different type of signal, for example an electric signal. A modulated light beam 24 carries a portion of the pattern data for controlling one or more blankers that are coupled to a corresponding light sensitive element. In some embodiments, the light beams may, at least partially, be transferred towards the light sensitive elements by means of an optical waveguide.

The modulated beamlets coming out of the beamlet modulator are projected as a spot onto a target surface of a target 13 by the beamlet projector. The beamlet projector typically comprises a scanning deflector for scanning the modulated beamlets over the target surface and a projection lens system for focusing the modulated beamlets onto the target surface. These components may be present within a single end module.

Such end module is preferably constructed as an insertable, replaceable unit. The end module may thus comprise a deflector array 11, and a projection lens arrangement 12. The insertable, replaceable unit may also include the beamlet stop array 10 as discussed above with reference to the beamlet modulator. After leaving the end module, the beamlets 7 impinge on a target surface positioned at a target plane. For lithography applications, the target 13 usually comprises a wafer provided with a charged-particle sensitive layer or resist layer.

The deflector array 11 may take the form of a scanning deflector array arranged to deflect each beamlet 7 that passed the beamlet stop array 10. The deflector array 11 may comprise a plurality of electrostatic deflectors enabling the application of relatively small driving voltages. Although the deflector array 11 is drawn upstream of the projection lens arrangement 12, the deflector array 11 may also be positioned between the projection lens arrangement 12 and the target surface.

The projection lens arrangement 12 is arranged to focus the beamlets 7, before or after deflection by the deflector array 11. Preferably, the focusing results a geometric spot size of about 10 to 30 nanometers in diameter. In such preferred embodiment, the projection lens arrangement 12 is preferably arranged to provide a demagnification of about 100 to 500 times, most preferably as large as possible, e.g. in the range 300 to 500 times. In this preferred embodiment, the projection lens arrangement 12 may be advantageously located close to the target surface.

In some embodiments, a beam protector (not shown) may be located between the target surface and the projection lens arrangement 12. The beam protector may be a foil or a plate provided with a plurality of suitably positioned apertures. The beam protector is arranged to absorb the released resist particles before they can reach any of the sensitive elements in the lithography system 1.

The projection lens arrangement 12 may thus ensure that the spot size of a single pixel on the target surface is correct, while the deflector array 11 may ensure by appropriate scanning operations that the position of a pixel on the target surface is correct on a microscale. Particularly, the operation of the deflector array 11 is such that a pixel fits into a grid of pixels which ultimately constitutes the pattern on the target surface. It will be understood that the macroscale positioning of the pixel on the target surface is suitably enabled by a target positioning system 14.

Commonly, the target surface comprises a resist film on top of a substrate. Portions of the resist film will be chemically modified by application of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. High-quality projection is therefore relevant to obtain a lithography system that provides a reproducible result. No difference in irradiation ought to result from deflection steps.

Figure 2:
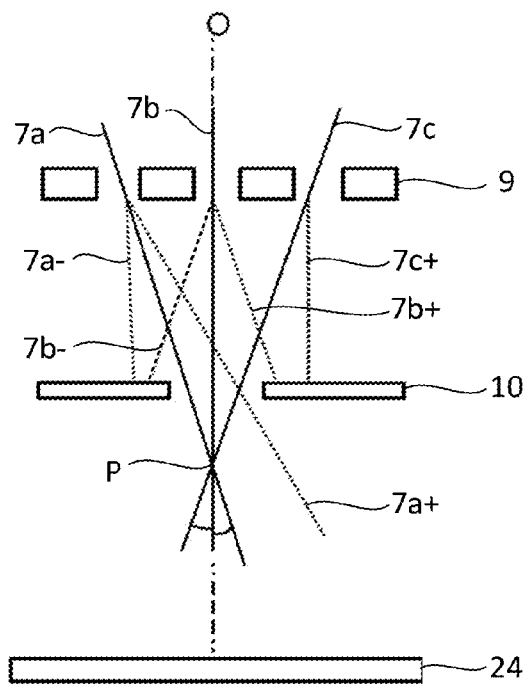
FIG. 2 schematically shows the operation of an embodiment of the beamlet blanker array in the lithography system of FIG. 1.

FIG. 2 schematically shows the operation of an embodiment of the beamlet blanker array 9 in the lithography system of FIG. 1. In particular, FIG. 2 schematically shows a cross-sectional view of a portion of a beamlet modulator comprising a beamlet blanker array 9 and beamlet stop array 10. The beamlet blanker array 9 is provided with a plurality of apertures. For sake of reference the target 13 has also been indicated. The figure is not drawn to scale.

The shown portion of the beamlet modulator is arranged to modulate three beamlets 7a, 7b, and 7c. The beamlets 7a, 7b, 7c may form part of a single group of beamlets that may be generated from a beam originating from a single source or from a single subbeam. The beamlet modulator of FIG. 2 is arranged for converging groups of beamlets towards a common point of convergence P for each group. This common point of convergence P is preferably located on an optical axis O for the group of beamlets.

Considering the shown beamlets 7a, 7b, 7c in FIG. 2, beamlets 7a, 7c have an incident angle extending between the beamlet and the optical axis O. The orientation of beamlet 7b is substantially parallel to the optical axis. The direction of beamlet deflection to establish blocking of deflected beamlets by the substrate of the beamlet stop array 10 may be different for each beamlet. Beamlet 7a is blocked by deflection towards the left, i.e. towards the "−"-direction in FIG. 2, indicated by dashed line 7a−. Beamlets 7b, 7c on the other hand are to be deflected towards the right, i.e. towards the "+"-direction, to established blocking of the respective beamlets. These blocking directions are indicated by dashed lines 7b+ and 7c+ respectively. Note that the choice of deflection direction may not be arbitrary. For example, for beamlet 7a, dashed line 7a+ shows that deflection of beamlet 7a towards the right would result in passage through the beamlet stop array 10. Therefore, deflection of beamlet 7a along line 7a+ would be inappropriate. On the other hand, deflection of beamlet 7b towards the left, indicated by dashed line 7b−, would be an option.

Figure 3:
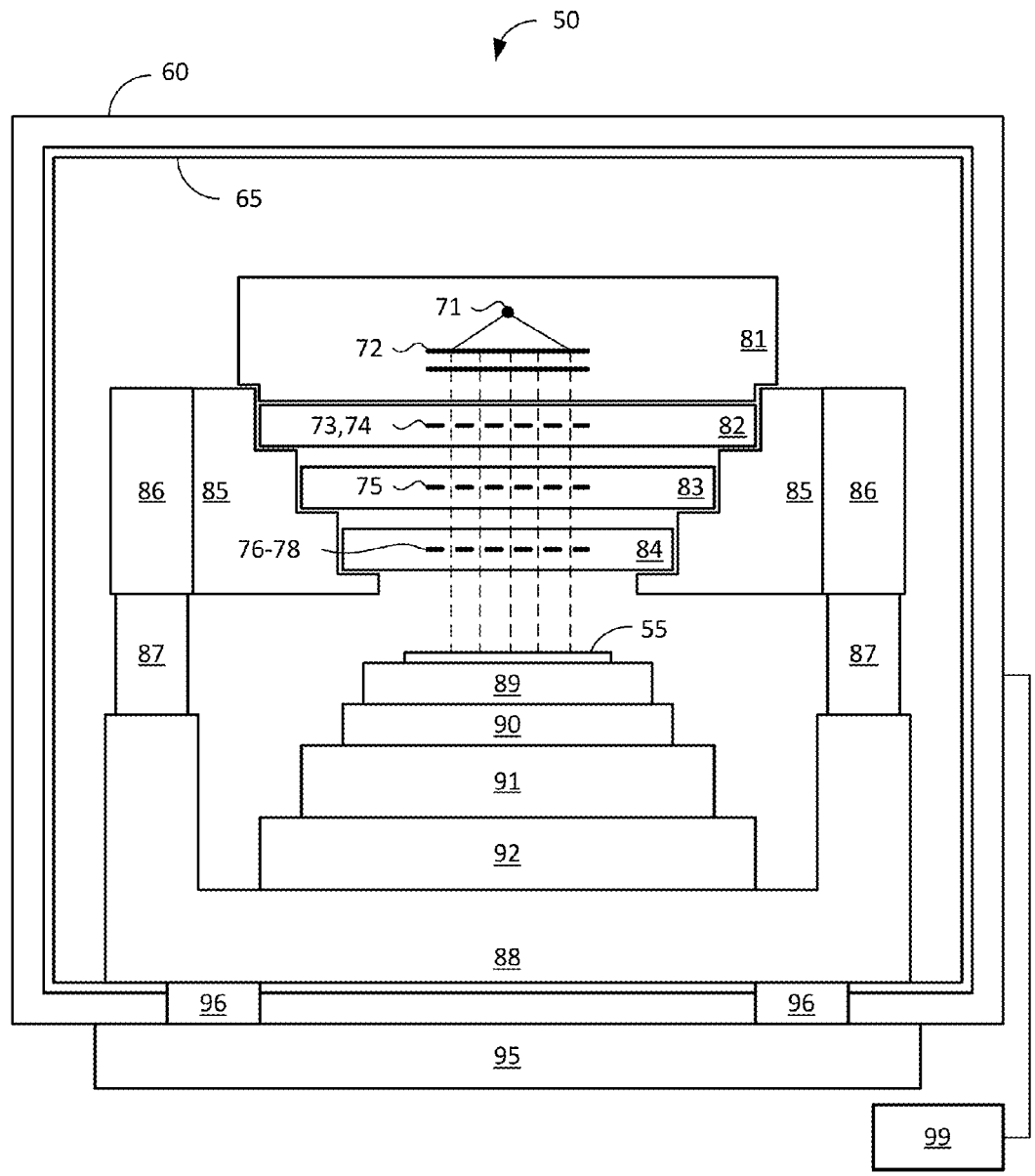
FIG. 3 shows a simplified block diagram of a modular lithography system.

FIG. 3 shows a simplified block diagram of a modular lithography system 50. The lithography system is preferably designed in a modular fashion to permit ease of maintenance. Major subsystems are preferably constructed in self-contained and removable modules, so that they can be removed from the lithography machine with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems.

In the embodiment shown in FIG. 3 these modular subsystems include an illumination optics module 81 including a charged particle beam source 71 and a beam collimating system 72, an aperture array and condenser lens module 82 including an aperture array 73 and a condenser lens array 74, a beam switching module 83 including a beamlet blanker array 75, and a projection optics module 84 including a beam stop array 76, a beam deflector array 77, and projection lens arrays 78. The modules may be designed to slide in and out from an alignment frame. In the embodiment shown in FIG. 3, the alignment frame comprises an alignment inner sub-frame 85 and an alignment outer sub-frame 86. The projection optics module 84 may be connected to at least one of the alignment inner sub-frame 85 and the alignment outer sub-frame 86 by means of one or more flexures.

Abovementioned components in the illumination optics module 81, the aperture array and condenser lens module 82, the beam switching module 83 and the projection optics module 84 may be arranged to operate in correspondence to the functionality of similar components in the lithography system 1 of FIG. 1.

In the embodiment of FIG. 3, a frame 88 supports the alignment sub-frames 85 and 86 via vibration damping mounts 87. In this embodiment, a wafer 55 rests on a wafer table 89, which is in turn mounted on further supporting structure 90. The combination of wafer table 89 and further supporting structure 90 may hereafter also be referred to as chuck 90. The chuck 90 sits on the stage short stroke 91 and long stroke 92. The lithography machine is enclosed in vacuum chamber 60, which preferably includes a mu metal shielding layer or layers 65. The machine rests on a base plate 95 supported by frame members 96.

Each module may require a large number of electrical signals and/or optical signals, and electrical power for its operation. The modules inside the vacuum chamber receive these signals from one or more control systems 99, which are typically located outside of the chamber. The vacuum chamber 60 includes openings, referred to as ports, for admitting cables carrying the signals from the control systems into the vacuum housing while maintaining a vacuum seal around the cables. Each module preferably has its collection of electrical, optical, and/or power cabling connections routed through one or more ports dedicated to that module. This enables the cables for a particular module to be disconnected, removed, and replaced without disturbing cables for any of the other modules. In some embodiments, a patch panel may be provided within the vacuum chamber 60. The patch panel comprises one or more connectors for removably connecting one or more connections of the modules. One or more ports may be used for admitting the one or more connections of the removable modules into the vacuum chamber.

Figure 4:
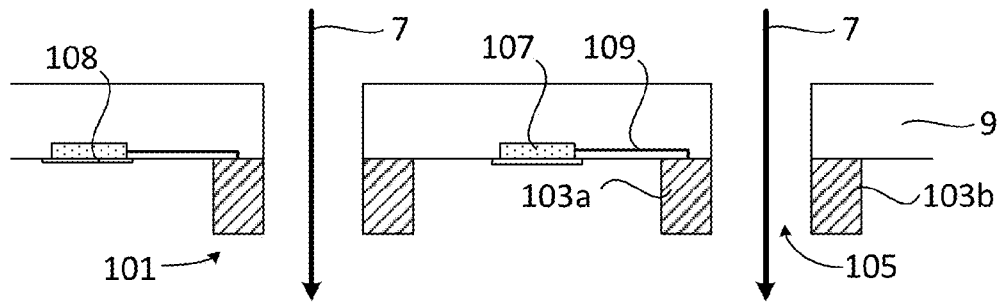
FIG. 4 schematically shows a cross-sectional view of a portion of a beamlet blanker array that may be used in the lithography system of FIG. 1.

FIG. 4 schematically shows a cross-sectional view of a portion of a beamlet blanker array 9 that may be used in the lithography system of FIG. 1. The beamlet blanker array 9 comprises a plurality of modulators 101. A modulator comprises a first electrode 103a, a second electrode 103b, and an aperture 105. The electrodes 103a, 103b are located on opposing sides of the aperture 105 for generating an electric field across the aperture.

A light sensitive element 107 is arranged to receive pattern data carrying light beams (not shown). The light sensitive element 107 is electrically connected to one or more modulators 101 via an electrical connection 109. The light sensitive element 107 receives pattern data via the light beams, converts the light signal into an electrical signal and then forwards the received and converted pattern data via the electrical connection 109 towards the one or more connected modulators 101. The one or more modulators 101 then modulate passing charged particle beamlets, such as electron beamlets 7 in accordance with the received pattern data. The light sensitive element 107 may be provided with an anti-reflection coating 108 to reduce background radiation caused by reflected light, which may disturb a correct readout of the data carried by the light beam.

Figure 5:
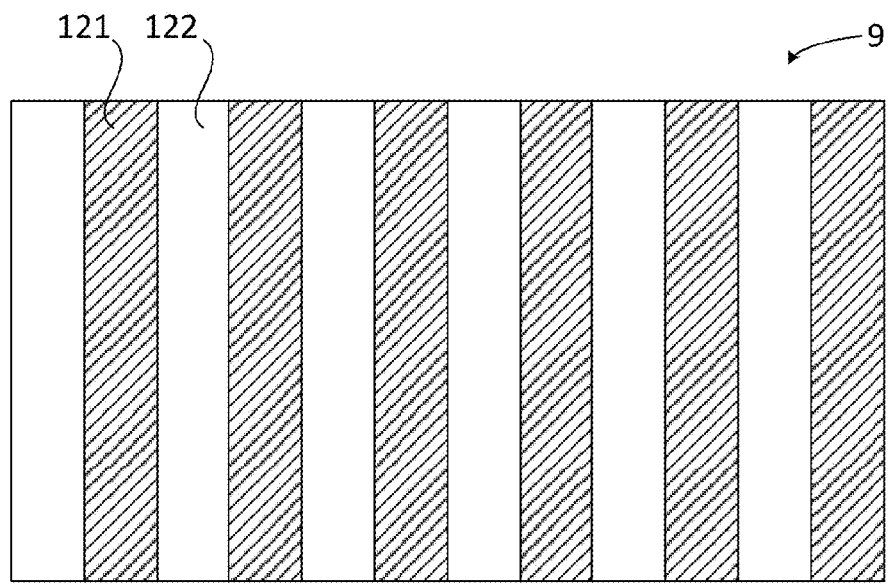
FIG. 5 schematically shows a top view of a lay-out of a beamlet blanker array that may be used in embodiments of the invention.

FIG. 5 schematically shows a top view of a lay-out of a beamlet blanker array 9 that may be used in embodiments of the invention. The beamlet blanker array 9 shown in FIG. 5 is divided into beam areas 121 and non-beam areas 122. Although the width of the beam areas 121 and non-beam areas 122 are shown to be about the same, this is not essential. The dimensions of the areas may differ based on the layout used.

The beam areas 121 include one or more modulators for modulating beamlets. The non-beam areas 122 include one or more light sensitive elements. The use of beam areas 121 and non-beam areas 122 in an optical column in a maskless lithography system has the advantage that the density of modulators and light sensitive area can be increased.

Although the beam areas 121 and the non-beam areas 122 are shown in an arrangement forming a perfect rectangle, the areas may actually form a skew arrangement to allow for an optimal projection of beamlets onto the target surface, as will be understood by a person skilled in the art.

Figure 6:
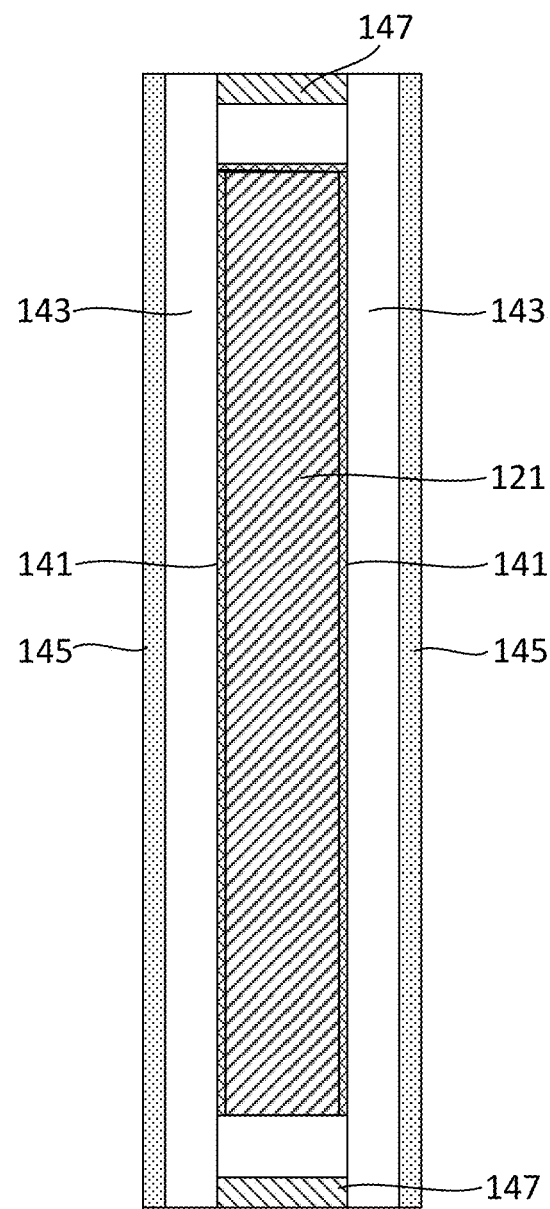
FIG. 6 schematically shows a top view of a more detailed lay-out of a beamlet blanker array that may be used in embodiments of the invention.

FIG. 6 schematically shows a top view of a more detailed lay-out of a portion of a beamlet blanker array 9 that may be used in embodiments of the invention. The blanker array portion includes a beam area 121 surrounded by an area reserved for a shielding structure 141. The beamlet blanker array 9 further includes a non-beam area, which effectively is all the space that is not reserved for the beam area 121 and the shielding structure 141. The shielding structure 141 is arranged to substantially shield electric fields that are externally generated, for example in the proximity of light sensitive elements, such as photodiodes, within the non-beam areas.

The shielding structure 141 can be described as comprising side walls forming an open-ended box-like structure. Note that the shielding structure 141 is not necessarily physically connected to the beamlet blanker array 9. If located within sufficiently close distance of the beamlet blanker array 9 the shielding structure 141 can still sufficiently shield electric fields.

Materials suitable for the shielding structure 111 are materials with sufficiently high electric conductivity. Additionally, the material should have sufficient strength and workability. An exemplary suitable material for use as main component of the shielding structure is titanium (Ti). Other exemplary materials that may be used include molybdenum (Mo) and aluminum (Al). In an exemplary embodiment, the shielding structure is made using Ti-plates coated with Mo. In another exemplary embodiment the shielding structure includes a stack of Mo sheets with Al spacers.

The beamlet blanker array portion of FIG. 6 further includes an optical interface area 143 reserved for establishing an optical interface between optical fibers arranged for carrying light signals and light sensitive elements within the beamlet blanker array 9. The light sensitive elements, such as photodiodes, are thus placed within the optical interface area 143. The optical fibers may cover the entire optical interface area 143 or a portion thereof. The optical fibers are suitably arranged so that they do not physically block electron beamlets within the beam area 121 during use of the lithography system.

Additionally, the non-beam area of the beamlet blanker array 9 includes a power interface area 145. The power interface area 145 is arranged to accommodate a power arrangement for suitably powering the light sensitive elements, and optionally other components, within the optical interface area 143. The power arrangement 145 may extend in a direction substantially perpendicular to, and away from the blanker array 9. Such arrangement 145 may enable the spread of the power lines over a large surface area, which improves the efficiency and reduces losses, e.g. due to a reduced thermal resistance caused by an increased radiation surface area.

The position of the power interface area 145 on the sides of the optical interface area 143 enables the use of relatively short power supply lines to the light sensitive elements. Consequently, the variation in voltage drop between different power lines, i.e. connections with nearby light sensitive elements versus connections with light sensitive elements further away, can be reduced.

The non-beam area may further include an additional interface area 147 to enable the accommodation of further circuitry, for example a clock and/or a control. The power arrangement within the power interface area 145 may also be arranged to provide sufficient power to the additional interface area 147.

Although FIG. 6 schematically shows a very specific lay-out of the several areas, it will be understood that it is possible to have a different lay-out. Similarly, the size and shape of the different interface areas may vary in dependence of the specific application.

Figure 7A:
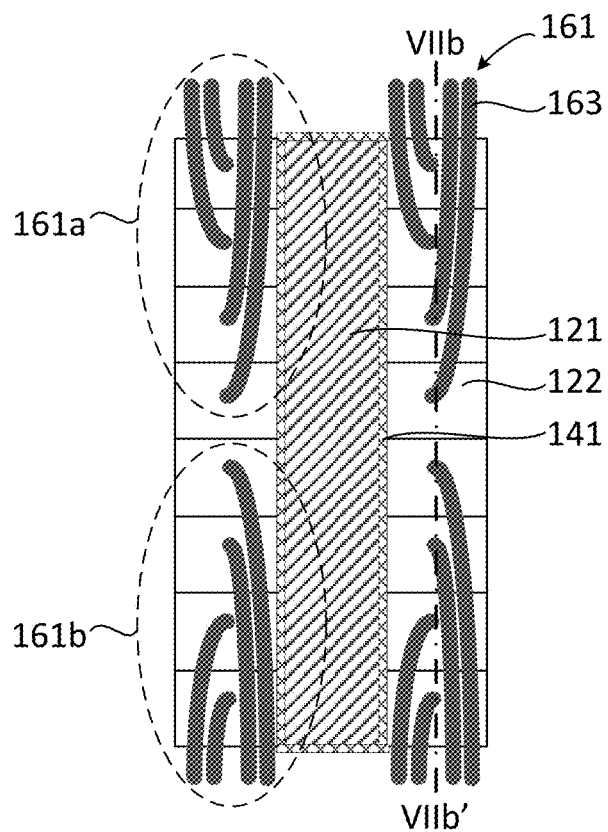
FIG. 7A schematically shows an optical fiber arrangement on top of the beamlet blanker array of FIG. 5.

FIG. 7A schematically shows an exemplary embodiment of an optical fiber arrangement 161 selectively placed over the beamlet blanker array 9 of FIG. 5. The optical fiber arrangement 161 comprises a plurality of optical fibers 163 arranged to guide pattern data carrying light beams towards the light sensitive elements within the non-beam areas 122. The fibers 163 are positioned such that they do not hinder a passage of charged particle beamlets arranged to pass through the apertures within the beam area 121 of the beamlet blanker array 9.

The exemplary optical fiber arrangement 161 of FIG. 7A comprises two portions per non-beam area 122. A first portion 161a comprises a number of fibers 163 that enter a space above the non-beam area 122 from one side, while the second portion 161b comprises a number of fibers 163 entering the space above the non-beam area 122 at an opposing side. The number of fibers 163 within each portion 161a, 161b may be equal to each other. The use of different portions allows for more space per fiber 163, and reduces the risk of damaging the fibers 163.

Alternatively, all fibers 163 may enter the space above the non-beam area 122 from one side. In such case, the other side may be used to accommodate power circuitry, for example to supply power to power lines within the power interface area 145 in FIG. 6. Furthermore, the entry of fibers at one side may simplify maintenance operations. For example, in case of fiber replacement, only one side of the system needs to be dismantled.

Figure 7B:
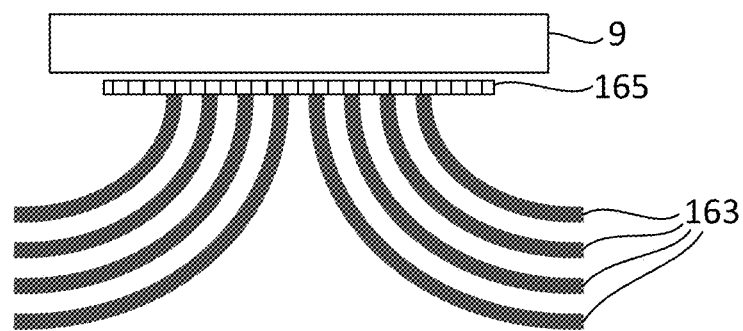
FIG. 7B schematically shows a cross-sectional view of the arrangement shown in FIG. 7A along the line VIIB-VIIB'.

FIG. 7B schematically shows a cross-sectional view of the arrangement shown in FIG. 7A along the line VIIB-VIIB'. The fibers 163 within the arrangement 161 terminate in a body 165 forming a fiber array. The body 165 typically takes the form of a substrate, and will hereafter be referred to as substrate 165. The ends of the fibers within the substrate 165 are directed towards the light sensitive elements (not shown) within the non-beam area of the beamlet blanker array 9. As will be discussed in more detail, the substrate 165 is placed in close proximity of, and secured, or fixated, to the surface of the beamlet blanker array 9. Such position minimizes alignment errors due to poorly oriented fibers 163 within the substrate 165.

Figure 8:
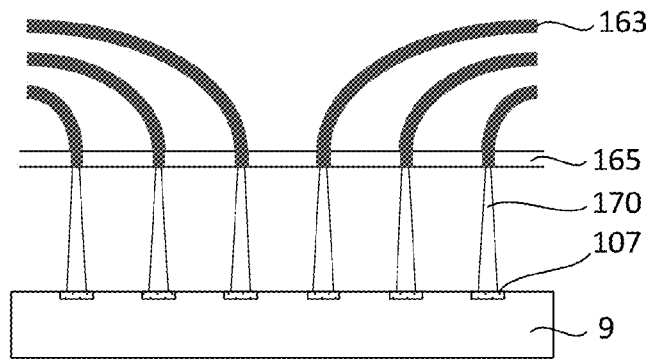
FIG. 8 schematically shows a more detailed view of the alignment between optical fibers and corresponding light sensitive elements.

FIG. 8 schematically shows a more detailed view of the alignment between optical fibers 163 within the substrate 165 and corresponding light sensitive elements 107 within the non-beam area of the blanker array 9. The substrate 165 is placed in close proximity to the light sensitive elements 107, preferably at a distance smaller than about 100 microns, more preferably at a distance smaller than about 50 microns. Due to the short distance between the light sensitive elements 107 and the fiber ends, optical communication using light beams 170 can be achieved with reduced light loss.

The alignment of the fibers 163 in the substrate 165 and the light sensitive elements 107 in the blanker array 9 is fixed. This can be done after an alignment procedure, which may include the use of markers, such as optical markers, on the blanker array 9. Alternatively, both the substrate 165 and the array of light sensitive elements 107 on the blanker array 9 are manufactured with sufficient precision that alignment of the two structures with respect to each other leads to sufficient alignment between corresponding fibers 163 and light sensitive elements 107. In case test results before actual operation of the lithography system show that a combination of a specific fiber 163 and a corresponding light sensitive element 107 does not perform according to the predetermined specifications, such combination may be excluded by the control unit during lithographic processing.

Figure 9A:
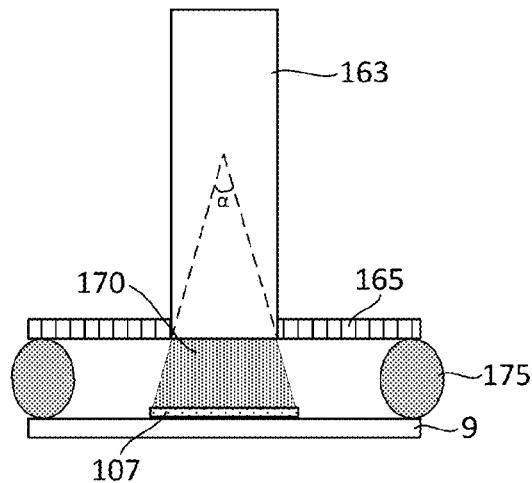
FIGS. 9A, 9B schematically show two different ways of connecting a fiber array substrate to a blanker array.
Figure 9B:
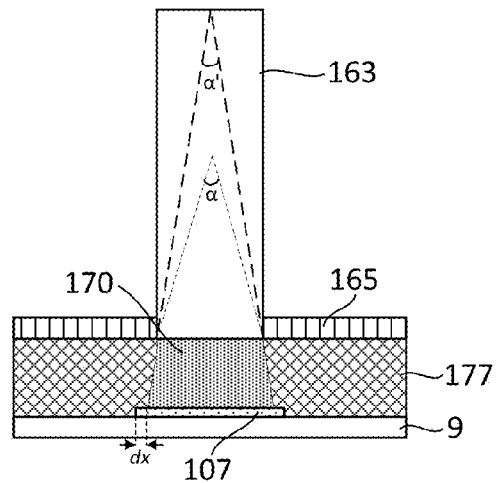

FIGS. 9A, 9B schematically show two different ways of connecting a substrate 165 to a blanker array 9. In both FIGS. 9A, 9B, only a single combination of a fiber 163 and a light sensitive element 107 is shown.

In FIG. 9A the substrate 165 is connected to the blanker array 9 using an adhesive 175. The adhesive 175 may be a suitable glue, for example an epoxy glue. The adhesive 175 contacts the blanker array 9 such that there is no contact between the adhesive and the light sensitive element 107. This way of fixating allows for the use of small quantities of adhesive, and is easy to execute.

As also shown in FIG. 8, the light beams 170 exiting the fibers 163 diverge. As a result, the beam spot size on the surface of the blanker array 9 increases with an increase of the distance between the substrate 165 and the blanker array 9. Furthermore, the light intensity of the beam spot per unit area decreases. Therefore, an increase in distance between the substrate 165 and the blanker array 9 may reduce the portion of the light beam 170 that can be captured by the light sensitive element 107. In particular in case the light spot formed on the light sensitive element 107 is designed to entirely fall within the light sensitive surface of the light sensitive element 107, alignment errors may have a more profound effect in case the distance between the substrate 165 and the blanker array 9 becomes too large.

In some cases, in particular when it is not desirable to reduce the distance between the fiber and the light sensitive element, fixating is preferably done using a suitable transparent adhesive layer 177, sometimes referred to as underlay, as schematically shown in FIG. 9B. The transparent adhesive layer 177 is in contact with a large portion of both the blanker array 9 and the substrate 165, and may act as a filler such as Silica which effectively fills the gap between the blanker array 9 and the substrate 165. Preferably, the transparent adhesive layer 177 is of a material with a thermal expansion coefficient as close as possible to the materials of the substrate 165 and blanker array 9.

Contrary to adhesive 175 shown in FIG. 9A, the adhesive layer 177 used in the embodiment of FIG. 9B is also in contact with the light sensitive element 107. The material within the adhesive layer 177 preferably has a sufficiently high refractive index for reducing the opening angle of the light beam 170 exiting the optical fiber 163. The use of the adhesive layer 177 with a sufficiently high refractive index has the advantage that the alignment tolerance is improved.

For example, in FIG. 9A, the light beam 170 exiting the optical fiber 163 has an opening angle $\alpha$ that is such that the light sensitive element 107 is entirely covered. However, if the alignment between the optical fiber 163 and the light sensitive element 107 is not perfect, a portion of the light will not fall onto the light sensitive element 107. Consequently, the light output received by the light sensitive element 107 readily decreases upon imperfect alignment.

In FIG. 9B, due to the presence of the adhesive layer 177 comprising a material with a sufficiently high refractive index, the opening angle of the light exiting the fiber 163 has an opening angle $\alpha'$, where angle $\alpha'$ is smaller than angle $\alpha$. The smaller opening angle reduces the spot size of the beamlet that falls onto the light sensitive element, while the light output of the spot is the same. Consequently, as schematically shown in FIG. 9B, even in case the optical fiber 163 and the light sensitive element are misaligned over a distance dx, the light sensitive element 107 still captures the entire beam 170, and the light output received by the light sensitive element merely starts to reduce if misalignment becomes greater than such distance dx. The embodiment shown in FIG. 9B is thus less susceptible to reduced performance caused by small alignment errors.

A suitable material for the adhesive layer 177 is an epoxy adhesive or glue substantially transparent to the light emitted by the fiber 163 and having a sufficiently high refractive index, for example higher than 1.4, preferably higher than about 1.5.

It will be recognized that other fixating constructions may be used as well. For example, the substrate 165 and the blanker array 9 may be connected by using connector elements such as Dowel pins.

Furthermore, at least one of the beamlet blanker array and the fixated fiber substrate may be provided with one or more mutual locating elements. Examples of such location elements include, but are not limited to a protrusion and a stop.

Figure 10:
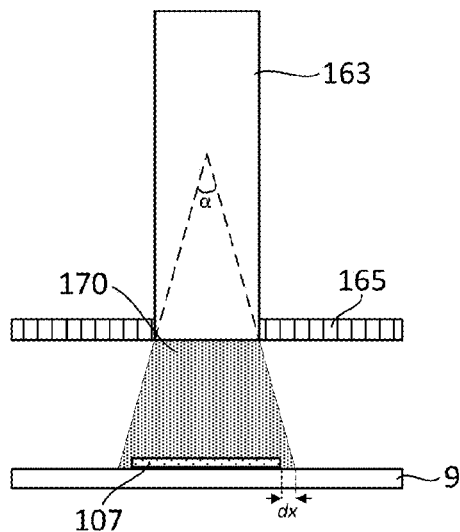
FIG. 10 schematically shows yet another way of aligning a fiber array substrate to a blanker array.

Another possibility to limit the influence of alignment errors is to make the spot size of the light beam 170 is greater than the light sensitive surface of the light sensitive element 107, as schematically depicted in FIG. 10. In such case, the intensity of the light beam portion that is projected onto the light sensitive element 107 should be sufficient for proper operation thereof. In the embodiment of FIG. 10, assuming the light is substantially homogeneously distributed throughout the beam 170, misalignment of the optical fiber 163 with respect to the light sensitive element 107 over a distance dx or less does not have an influence on the amount of light being captured by the light sensitive element 107. The light output received by the light sensitive element 107 starts to reduce if the misalignment exceeds such distance dx. Consequently, the embodiment shown in FIG. 10 is less susceptible to reduced performance caused by small alignment errors.

Figure 11:
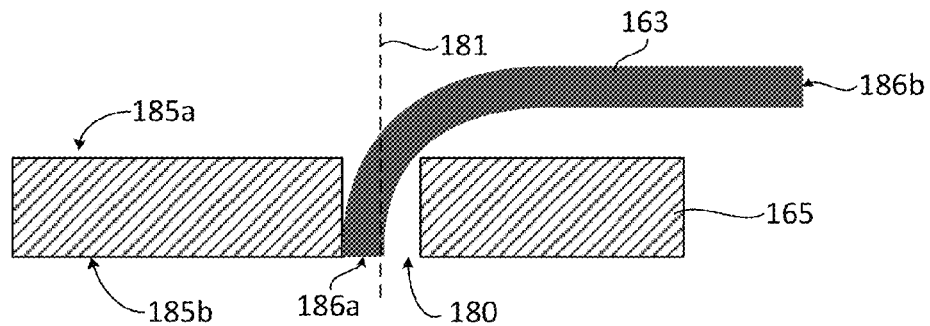
FIG. 11 schematically shows a cross-sectional view of a portion of a fiber array substrate.

FIG. 11 schematically shows a cross-sectional view of a portion of a fiber array. The fiber array comprises a substrate 165 with a plurality of apertures 180 arranged for accommodating a plurality of fibers 163. For purposes of clarity, only a single aperture 180 and corresponding fiber 163 is shown in FIG. 11.

The substrate 165 has a fiber receiving surface side 185a, also referred to as first surface, and a light transmitting surface side 185b, also referred to as second surface. The apertures 180 extend through the substrate from the first surface to the second surface. The fiber 163 comprises a transmitting end 186a and a trailing end 186b. The length of the fiber 163 is typically much longer than the length shown in FIG. 11.

Placement of the fibers 163 in the apertures 180 may be done by inserting the fibers 163 in the apertures 180 from the first surface side such that a fiber end extends through at least the majority of the aperture 180. In other words, the light transmitting end 186a of the fiber 163 is in close proximity of the second surface side 185b of the substrate 165. After insertion, the one or more fibers 163 are bent such that the fiber extends in a direction that differs from the direction of the center line through the aperture (denoted in FIG. 11 by dashed line 181).

The placement technique described above and schematically depicted in FIG. 11 makes use of the resilience of the fiber 163. This resilience forces the fiber 163 towards a side of the aperture 180 (in FIG. 11 the side wall on the left side). In other words, the fiber bending applies a pre-load between fiber 163 and substrate 165 which moves the fiber towards an aperture side. Consequently, by bending the fiber 163 in a predetermined direction, the fiber 163 abuts a side wall of the aperture 180 at a predetermined position, i.e. generally opposite to the direction into which the fiber 163 is bent. The force that is created due to the bending depends on the stiffness of the fiber 163 and its bending radius. To minimize displacement and/or deformation of the substrate as a result of a force exerted by a bent fiber 163 onto the side wall of the aperture 180, the substrate 165 is preferably secured during fiber placement, for example by using a chucking arrangement, such as a vacuum chuck arrangement.

The aperture size is preferably large compared to the outer diameter of the fiber 163 to improve the fiber placing tolerance. Typically, an optical fiber 163 comprises a core surrounded by a cladding layer, which in its turn is surrounded by an outer coating or "jacket". In some embodiments, the fibers 163 are stripped prior to insertion, i.e. the outer coating is removed. In some other embodiments, the fibers 163 are not stripped. In case the portions of the fibers 163 that are to be inserted in the apertures 180 are stripped, the aperture size is preferably greater than the diameter of the fiber core and the cladding layer. In case the fibers 163 are not stripped, the aperture size 180 is preferably greater than the outer diameter of the fibers 163 including the outer coating. Most preferably, the aperture diameter is greater than the outer diameter of the unstripped fiber 163 to allow the use of unstripped fibers within the substrate 165. The use of unstripped fibers 163 reduces the time consumed by fiber pre-processing because there is no need to strip the fibers 163.

After insertion and bending of the fiber 163, the fiber 163 may be secured, also referred to as fixated or fixation. Fixation may be achieved by using an adhesive, such as a suitable glue. Preferably, the adhesive has a low viscosity of about 100-500 mPas to allow capillary forces to distribute the adhesive in contact with the fiber 163. Furthermore, the thermal expansion coefficient of the adhesive is preferably as close as possible to the material of the substrate 165. In some embodiments, the adhesive is curable with UV light. Alternatively, the adhesive may be curable in a different way, for example by applying heat. Generally, curing is time consuming. Therefore, securing of the fibers 165 is preferably done after insertion and bending of all fibers 163.

Alternatively, or additionally, it is also possible to use a different type of fixation, such as mechanical clamping. In case of the use of an adhesive, the adhesive may be provided onto the light transmitting fiber end 186a prior to placement of the fiber 163 in the aperture 180. Such procedure allows for accurate placement of the adhesive onto the fiber end 186a, while the amount of adhesive being used may be limited. Curing of the adhesive may then take place after bending the respective fiber 163 or after insertion and bending of all other fibers.

Figure 12A:
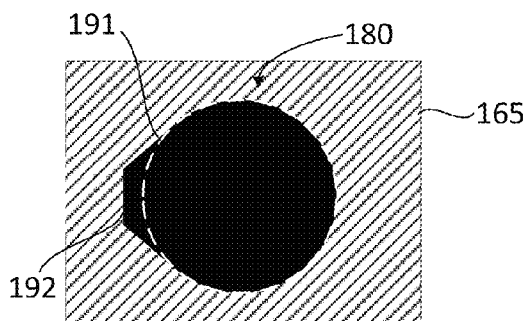
FIGS. 12A, 12B schematically show a top view of an aperture in a fiber array substrate.
Figure 12B:
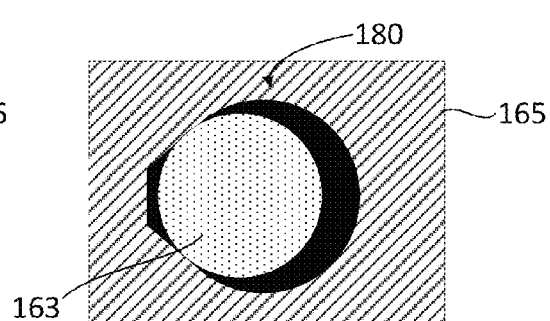

To enhance the position tolerance of the fiber 163, the aperture 170 preferably has a shape that guides the fiber 163 to abovementioned predetermined position as a result of fiber bending. FIGS. 12A, 12B schematically show a top view of an aperture 180 in a substrate 165 where the aperture 180 has an asymmetric shape to enable the fiber to move towards a predetermined position during bending. The cross-sectional shape of the aperture 180 has two portions 191, 192. The first portion 191 is a circular portion 191 (denoted by the white dashed circle) with a diameter that is greater than the diameter of the fiber portion that is to be inserted in the aperture 180. The second portion 192 is an additional portion directly adjacent to the circular portion 191 and takes the form of a groove. The shown shape of the additional portion 192 is a mere example. It will be well understood that alternative shapes may be used as well.

If, in the aperture shown in FIGS. 12A, 12B, a fiber 163 is inserted in the aperture 180 and then bent to the right, the fiber 163 will be forced to position itself in the additional "groove-shaped" portion 192 of the aperture 180 in a way as schematically shown in FIG. 12B. Due to the shape of the additional portion 192 the fiber position at which the fiber 163 sticks can be anticipated. The shape and size of the additional portion 174 thus enable the fiber 163 to position itself at a predetermined position at which the fiber abuts a side wall of the aperture. The shape and size of the additional portion 192 may be tailored to the type and/or size of the fiber 163 being used.

Figure 13:
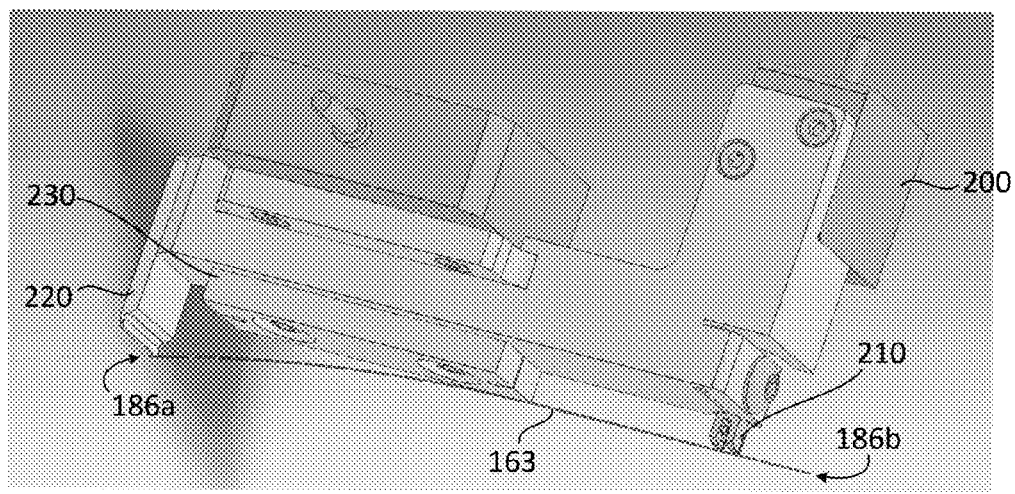
FIG. 13 schematically shows a gripping device that may be used to form an arrangement of optical fibers.

FIG. 13 schematically shows a gripping device 200 that may be used to form an arrangement of optical fibers, such as a fiber array as discussed above. The gripping device 200 comprises a first gripper 210, a second gripper 220 and a third gripper 230. The first gripper 210 is arranged for holding the fiber 163 at a position closer to the trailing end 186b than to the light transmitting end 186a. The first gripper 210 may include a groove, such as a V-groove 211 for that purpose. The second gripper 220 is arranged for holding the fiber 163 at a position closer to the light transmitting end 186a than to the trailing end 186b. The second gripper 220 may also include a groove, such as a V-groove 221 for that purpose. The third gripper 230 is arranged for fixating the fiber for gluing. The third gripper may include a notch for that purpose. The gripping device 200 may be arranged to apply a pre-load onto the fiber such that the fiber is slightly pre-bend prior to insertion in a corresponding aperture. Applying a pre-load alleviates fiber handling.

FIGS. 14A-14F depict different stages in a method of forming an arrangement of optical fibers according to an embodiment of the invention. As is clear from these drawings, different types of gripping devices may be used.

Figure 14A:
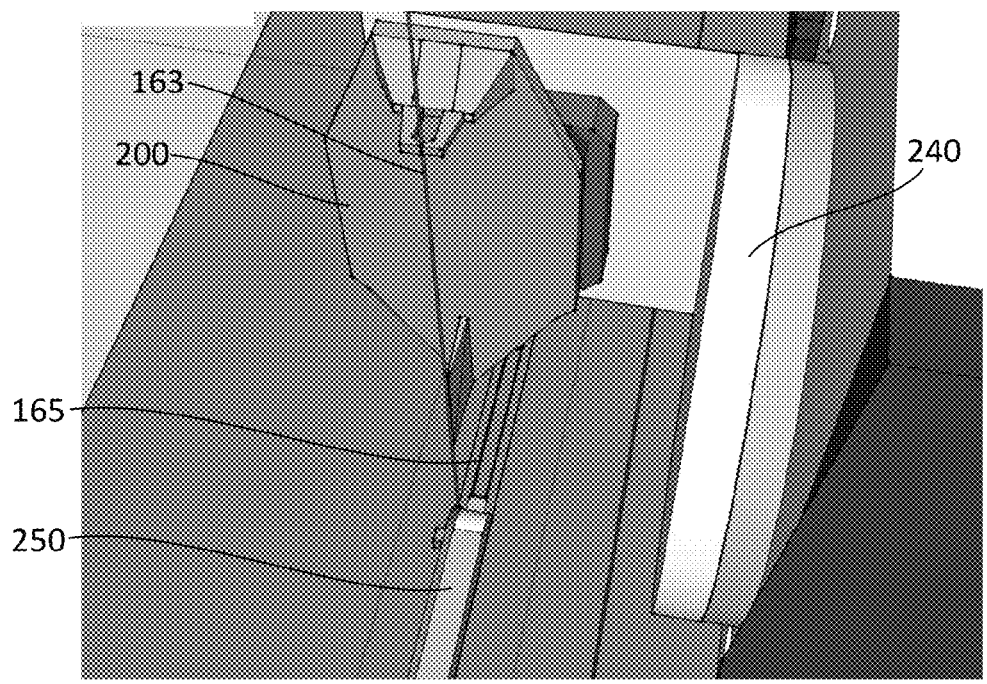
FIGS. 14A-14E depict different stages in a method of forming an arrangement of optical fibers according to an embodiment of the invention.

FIG. 14A shows a situation in which the gripping device 200 is part of a larger apparatus comprising a rotating member 240 and a bending structure 250. The gripping device is mounted onto the rotating member 240 such that it can rotate in a direction that enables the gripping device 200 to bend the fiber 163.

Figure 14B:
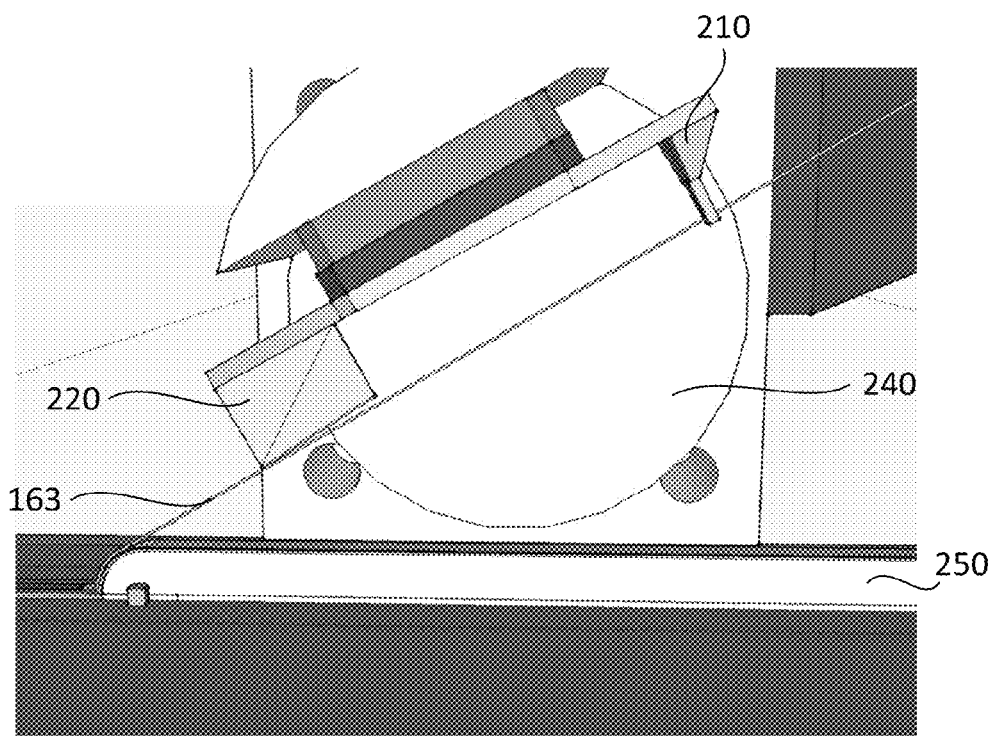
Figure 14C:
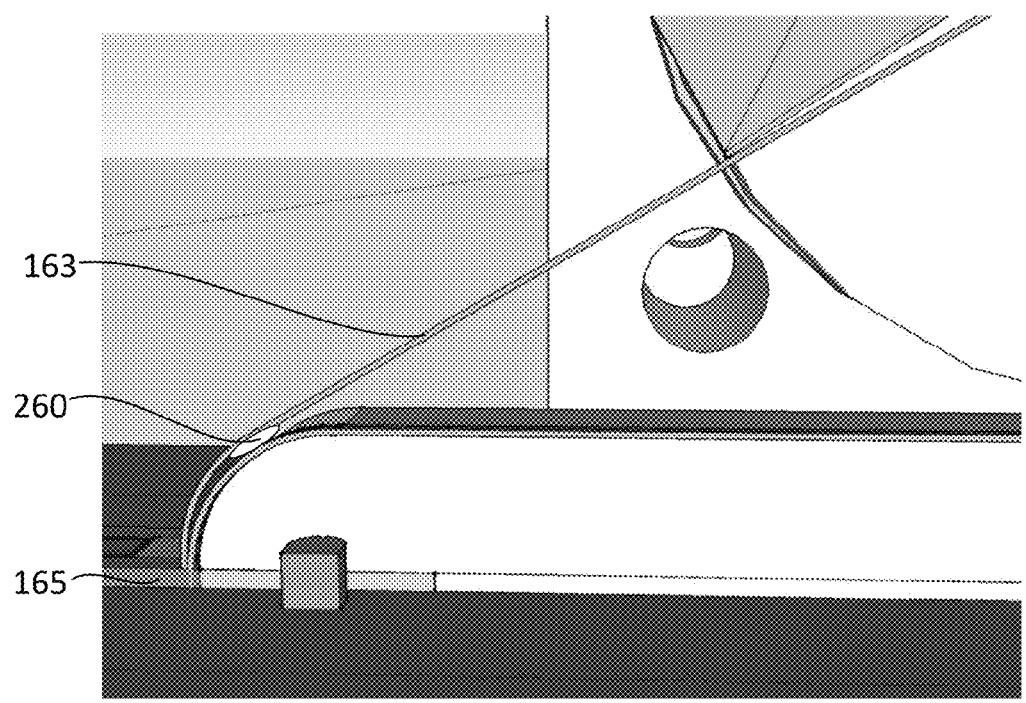

In the shown embodiment, the gripping device is arranged to insert the fiber 163 in the corresponding aperture and then to bend the fiber 163 using the bending structure 250. The bending is then such that the portion of the fiber 163 that extends from the first surface of the fiber array substrate can be bent over the bending structure 250, or, in case other fibers 163 are already bent on top of this structure 250, over already bent fibers 163. The bending structure 250 enables bending with a predetermined curvature. A side view of the actual bending over the bending structure 250 is shown in FIG. 14B.

Figure 15:
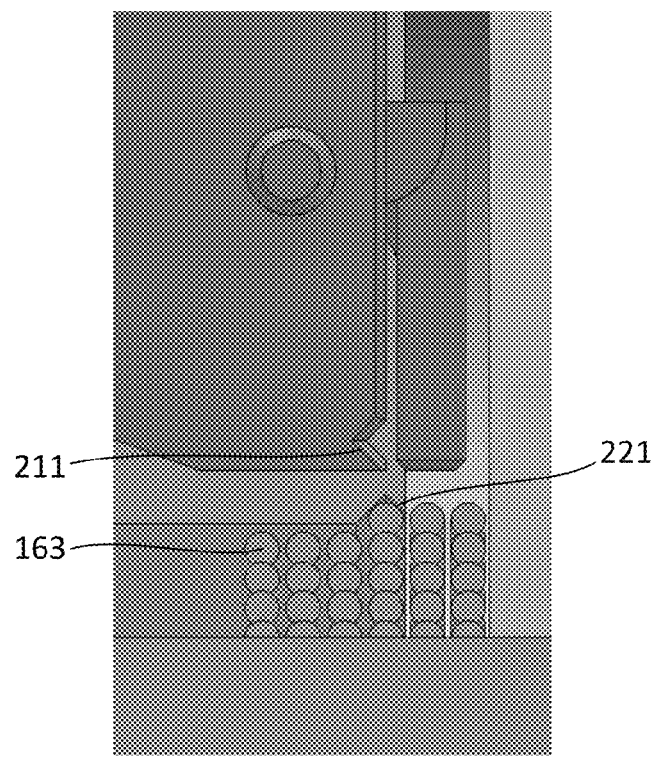
FIG. 15 depicts a cross-sectional view of a spatial arrangement of fibers being prepared using the method shown in FIGS. 14A-14E.

Preferably, in particular in case other fibers 163 have been bent earlier, prior to completion of bending, an adhesive 260 is applied to adhere the bent fiber onto a fiber 163 that has been bent earlier. Preferably, the fibers are stacked on top of each other in a predetermined spatial arrangement, for example a rectangular arrangement as schematically shown in FIG. 15. In a rectangular arrangement the fibers have a predetermined length. Knowledge of this length may improve the accuracy of controlling signals sent through the fibers.

Figure 14D:
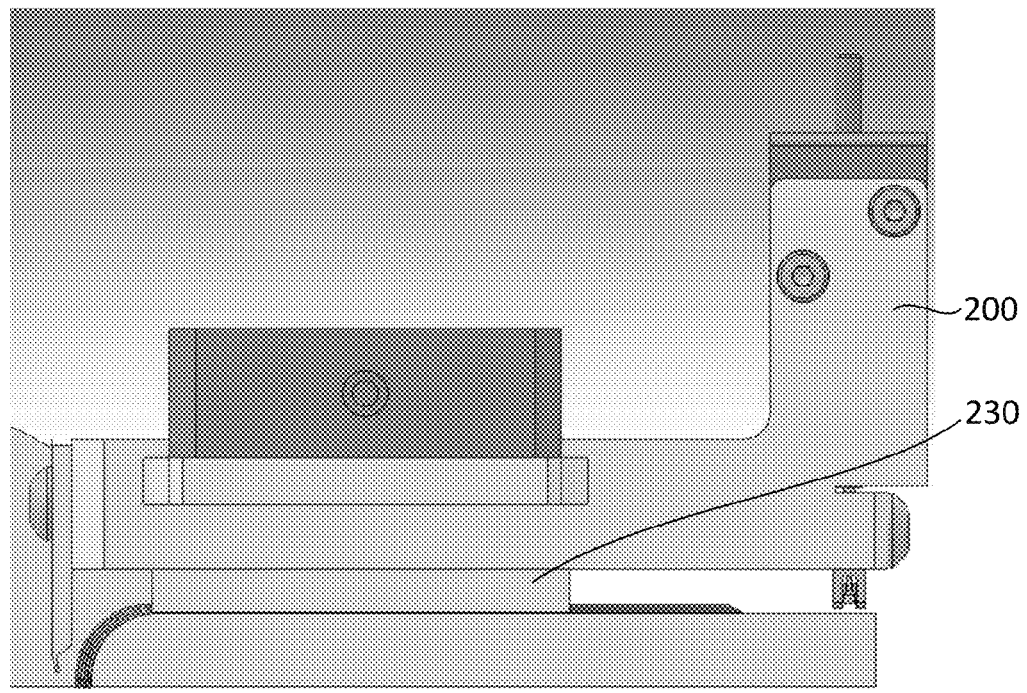

After positioning the fiber 163 on top of another fiber 163, the gripping device 200 may be used to fixate the upper fiber 163 for enabling of curing of the adhesive 260 being applied previously. For this purpose, the third gripper 230 may be used, for example by employing a suitable notch. This situation is shown in FIG. 14D.

Figure 14E:
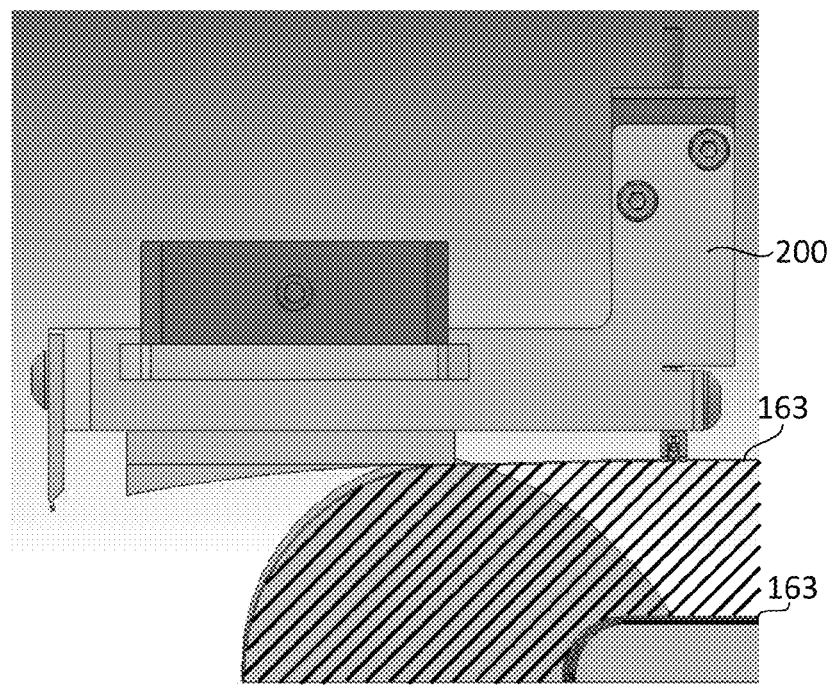

FIG. 14E shows the situation in which the last fiber is put on top. The packet of fibers is depicted as a hatched area.

Figure 16:
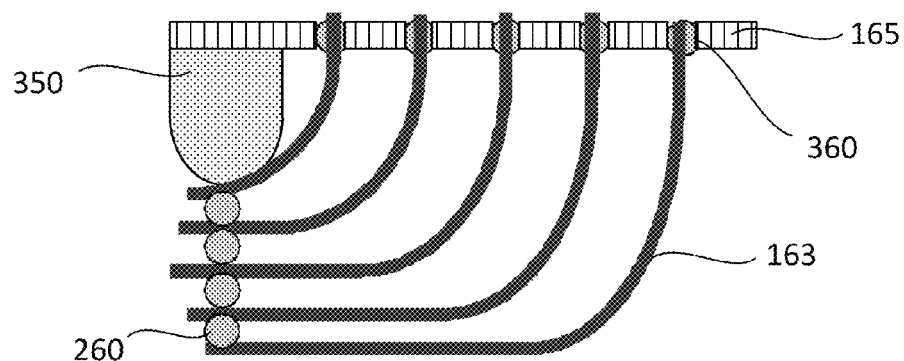
FIG. 16 schematically shows another embodiment of the optical fiber arrangement.

FIG. 16 schematically shows an embodiment of the optical fiber arrangement in which the fibers 163 are, after placement in the apertures and subsequent bending, secured by using an adhesive material 360, for example a suitable glue. As shown in this embodiment, the fibers 163 may extend through the apertures. Preferably, the height differences of the fibers 163 extending through the apertures in the substrate 165 is less than 0.2 microns. This may be achieved by polishing the substrate after placement and fixation of the fibers 163.

The fibers 163 may be guided towards the apertures via a supporting unit 350 that is connected, permanently or temporarily, to the substrate 165. The supporting unit 350 may simplify the bending of fibers 163. Furthermore, the presence of the supporting unit 350 may avoid that defects, such as kinks, develop during the bending process. The entire arrangement of fibers 163 and substrate 165 may be strengthened even further by connecting the fibers 163 to each other, and, in case the supporting unit 350 is permanent, preferably also to the supporting unit 350, for example by using an adhesive 260. The adhesive 360 used within the apertures of the substrate 165 may be the same as the adhesive 260. Fixating the fibers 163 into the fixation substrate 165 provides a robust fiber array which provides a reliable light output. Fixating the fibers 163 to each other, further improves the robustness of the design.

Figure 17:
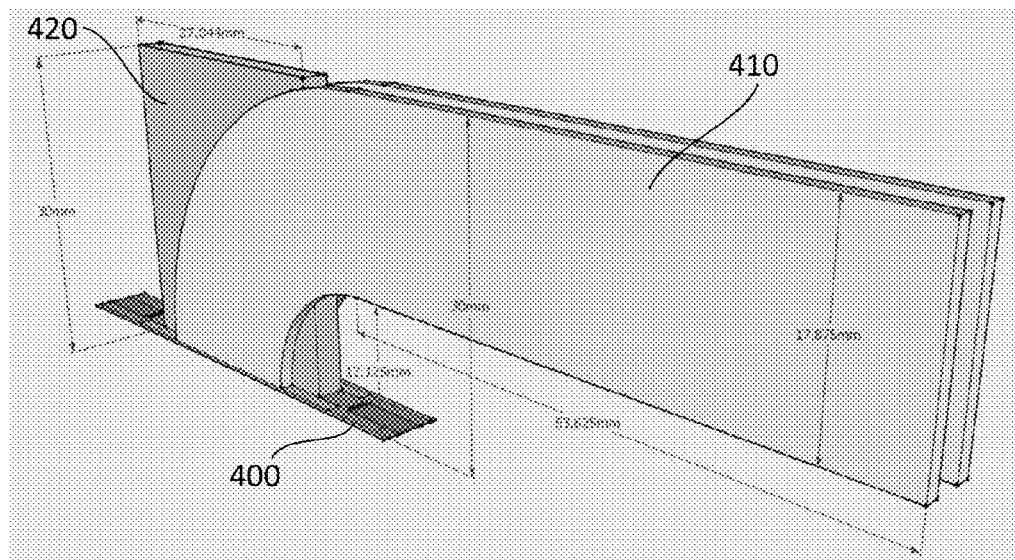
FIG. 17 shows a bonded fiber arrangement positioned on a surface of a beamlet blanker array.

FIG. 17 shows a bonded fiber arrangement 410 that is positioned in close proximity of a plurality of light sensitive elements positioned on a surface of a beamlet blanker array 400, for example a non-beam area 121 as depicted in FIG. 5, a lay-out of which is further explained with reference to FIG. 6. Structure 420 relates to a shield for shielding electromagnetic radiation. To form a bonded structure a mold may be formed around the plurality of bent fibers, and the mold may then be filled with an adhesive material. Finally, the adhesive material is cured, e.g. by using on eo more of UV-radiation, evaporation and heat. The resulting bonded structure is a robust structure that occupies limited space.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

What is claimed is:

1. A modulation device for use in a charged-particle multi-beamlet lithography system, the modulation device comprising:
   a beamlet blanker array for patterning the plurality of beamlets in accordance with a pattern; and
   an arrangement of optical fibers for providing pattern data carrying light beams,
wherein the beamlet blanker array comprises a plurality of modulators and a plurality of light sensitive elements, wherein the light sensitive elements are arranged to receive the pattern data carrying light beams and to convert the light beams into electrical signals, wherein a light sensitive element is electrically connected to one or more modulators for providing the received pattern data to the one or more modulators;

wherein the arrangement of optical fibers comprises:
- a substrate having a first surface and an opposing second surface, the substrate being provided with a plurality of apertures extending through the substrate from the first surface to the second surface, the substrate being arranged in close proximity to a surface of the beamlet blanker array;
- a plurality of fibers, each fiber having a fiber end with a diameter smaller than the smallest diameter of a corresponding aperture in the substrate,
- wherein each fiber is inserted from the first surface side of the substrate into the corresponding aperture so that the fiber end is positioned in close proximity of the second surface, the fiber having a length extending from the aperture out from the first surface;
- wherein the extending lengths of the fibers are formed into a bonded fiber arrangement having a rounded portion,
- wherein the extending length of each fiber is bent in conformity with the shape of the rounded portion of the bonded fiber arrangement in a direction substantially along a long-edge of an elongated area of the light sensitive elements, so that the fiber is no longer straight, such that the fiber abuts a side wall of the corresponding aperture at a predetermined position; and
- wherein the extending lengths of the fibers are bonded together using an adhesive.

2. The modulation device of claim 1, wherein the apertures in the substrate are arranged in an array at positions corresponding to an array of light sensitive elements, so that the fiber ends are positioned so that light emitted from the fiber ends is directed onto the light sensitive elements.

3. The modulation device of claim 1, wherein the extending lengths of the fibers are all bent in the same direction.

4. The modulation device of claim 1, wherein the apertures in the substrate are arranged in a two-dimensional array having rows, the fibers inserted into a first row of the apertures having a portion of their extending lengths bent at a first radius of curvature, and the fibers inserted into a next adjacent row of the apertures having a portion of their extending lengths bent at a second greater radius of curvature.

5. The modulation device of claim 1, wherein the apertures in the substrate are arranged in a two-dimensional array having rows, all of the fibers inserted into each row of the apertures having a portion of their extending lengths bent at a same radius of curvature, and the radius of curvature of the fibers of each row also being the same.

6. The modulation device of claim 1, wherein at least a portion of the extending lengths of the fibers are stacked in a predefined spatial arrangement in the bonded fiber arrangement and are bent over other fibers in conformity with the rounded portion of the bonded fiber arrangement.

7. The modulation device of claim 6, wherein at least a portion of the extending lengths of the fibers run parallel to each other in the rounded portion of the bonded fiber arrangement.

8. The modulation device of claim 1, wherein at least a portion of the extending lengths of the fibers are bonded together in the rounded portion of the bonded fiber arrangement using an adhesive.

9. The modulation device of claim 1, wherein the fiber ends are secured within the apertures.

10. The modulation device of claim 1, wherein the apertures have a cross-sectional shape consisting of a circular portion and an additional portion in the form of a groove, and wherein the fibers are bent in such direction that the predetermined position at which the fibers abut the side wall of the apertures is within the additional portion.

11. A charged-particle multi-beamlet lithography system for transferring a pattern onto the surface of a target using a plurality of charged particle beamlets, the system comprising:
- a beam generator for generating a plurality of charged particle beamlets; and
- the modulation device according to claim 1.

12. The modulation device of claim 1, wherein a number of the fibers at least has an order of thousands.

13. The modulation device of claim 1,
- wherein the beamlet blanker array is divided into a plurality of elongated beam areas and a plurality of elongated non-beam areas positioned adjacent to the beam areas so that a long edge of each beam area borders a long edge of an adjacent non-beam area,
- wherein each beam area comprises a plurality of the modulators without light sensitive elements, and each none-beam area comprises a plurality of the light sensitive elements without modulators,
- wherein the substrate is arranged in close proximity to a surface of a non-beam area of the beamlet blanker array,
- wherein the extending length of each fiber is bent in a direction substantially along a long-edge of the elongated non-beam area, so that the extending lengths of the fibers are arranged in a space bounded by a projection of the long-edge of the non-beam area perpendicular to the surface of the non-beam area.

* * * * *